(12) United States Patent
Hsieh et al.

(10) Patent No.: US 11,483,918 B2
(45) Date of Patent: *Oct. 25, 2022

(54) LIGHT SOURCE FOR LITHOGRAPHY EXPOSURE PROCESS

(71) Applicant: Taiwan Semiconductor Manufacturing Company, Ltd., Hsinchu (TW)

(72) Inventors: Chieh Hsieh, Taoyuan (TW); Shang-Chieh Chien, New Taipei (TW); Chun-Chia Hsu, Kaohsiung (TW); Bo-Tsun Liu, Taipei (TW); Tzung-Chi Fu, Miaoli (TW); Li-Jui Chen, Hsinchu (TW); Po-Chung Cheng, Zhongpu Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/239,826

(22) Filed: Apr. 26, 2021

(65) Prior Publication Data
US 2021/0243875 A1    Aug. 5, 2021

Related U.S. Application Data

(63) Continuation of application No. 16/671,347, filed on Nov. 1, 2019, now Pat. No. 10,993,308, which is a
(Continued)

(51) Int. Cl.
*H05G 2/00* (2006.01)
*G03F 7/20* (2006.01)

(52) U.S. Cl.
CPC ......... *H05G 2/008* (2013.01); *G03F 7/70033* (2013.01); *H05G 2/005* (2013.01)

(58) Field of Classification Search
CPC .................................................... H05G 2/008
See application file for complete search history.

(56) References Cited

U.S. PATENT DOCUMENTS

| 8,764,995 B2 | 7/2014 | Chang et al. |
| 8,796,666 B1 | 8/2014 | Huang et al. |
(Continued)

FOREIGN PATENT DOCUMENTS

CN    106094441 A    11/2016

OTHER PUBLICATIONS

Final Office Action dated Jul. 23, 2019, issued in U.S. Appl. No. 16/124,357.
(Continued)

*Primary Examiner* — Eliza W Osenbaugh-Stewart
(74) *Attorney, Agent, or Firm* — McClure, Qualey & Rodack, LLP

(57) ABSTRACT

A method for generating light is provided. The method further includes measuring a period of time during which one of targets from a fuel target generator passes through two detection positions. The method also includes exciting the targets with a laser generator so as to generate plasma that emits light. In addition, the operation of exciting the targets with the laser generator includes: irradiating a pre-pulse laser on the targets to expand the targets; detecting conditions of expanded targets; and adjusting at least one parameter of the laser generator according to the measured period of time and the conditions when the measured period of time is different from a predetermined value. The parameter of the laser generator which is adjusted according to the measured period of time includes a frequency for generating a laser for illuminating the targets.

20 Claims, 6 Drawing Sheets

Related U.S. Application Data continuation of application No. 15/868,373, filed on Jan. 11, 2018, now Pat. No. 10,477,663.

(60) Provisional application No. 62/586,992, filed on Nov. 16, 2017.

(56) References Cited

U.S. PATENT DOCUMENTS

| | | |
|---|---|---|
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,625,824 B2 | 4/2017 | Lu et al. |
| 10,477,663 B2 * | 11/2019 | Hsieh ................. H05G 2/008 |
| 2009/0272919 A1 | 11/2009 | Abe et al. |
| 2015/0083936 A1 | 3/2015 | Wehrens |
| 2015/0102239 A1 | 4/2015 | Yanagida et al. |
| 2015/0294744 A1 | 10/2015 | Sekine et al. |
| 2016/0037616 A1 | 2/2016 | Saito et al. |
| 2017/0048957 A1 * | 2/2017 | Riggs ................. H05G 2/008 |
| 2017/0064799 A1 | 3/2017 | Yabu et al. |
| 2018/0077786 A1 * | 3/2018 | Price ................. H05G 2/008 |

OTHER PUBLICATIONS

Chinese language office action dated Jul. 17, 2020, issued in application No. CN 201810987706.X.

* cited by examiner

US 11,483,918 B2

LIGHT SOURCE FOR LITHOGRAPHY EXPOSURE PROCESS

PRIORITY CLAIM AND CROSS-REFERENCE

This application is Continuation application of U.S. patent application Ser. No. 16/671,347, filed on Nov. 1, 2019, now U.S. Pat. No. 10,993,308, which is a Continuation Application of application Ser. No. 15/868,373, filed on Jan. 11, 2018, now U.S. Pat. No. 10,477,663, which claims the benefit of U.S. Provisional Application No. 62/586,992, filed on Nov. 16, 2017, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

For example, there is a growing need to perform higher-resolution lithography processes. One lithography technique is extreme ultraviolet lithography (EUVL). The EUVL employs scanners using light in the extreme ultraviolet (EUV) region, having a wavelength of about 1-100 nm. One type of EUV light source is laser-produced plasma (LPP). LPP technology produces EUV light by focusing a high-power laser beam onto small fuel droplet targets to form highly ionized plasma that emits EUV radiation with a peak of maximum emission at 13.5 nm. The EUV light is then collected by a collector and reflected by optics towards a lithography exposure object, e.g., a wafer.

Although existing methods and devices for generating EUV light have been adequate for their intended purposes, they have not been entirely satisfactory in all respects. Consequently, it would be desirable to provide a solution for increasing power conversion efficiency from the input energy for ionization.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
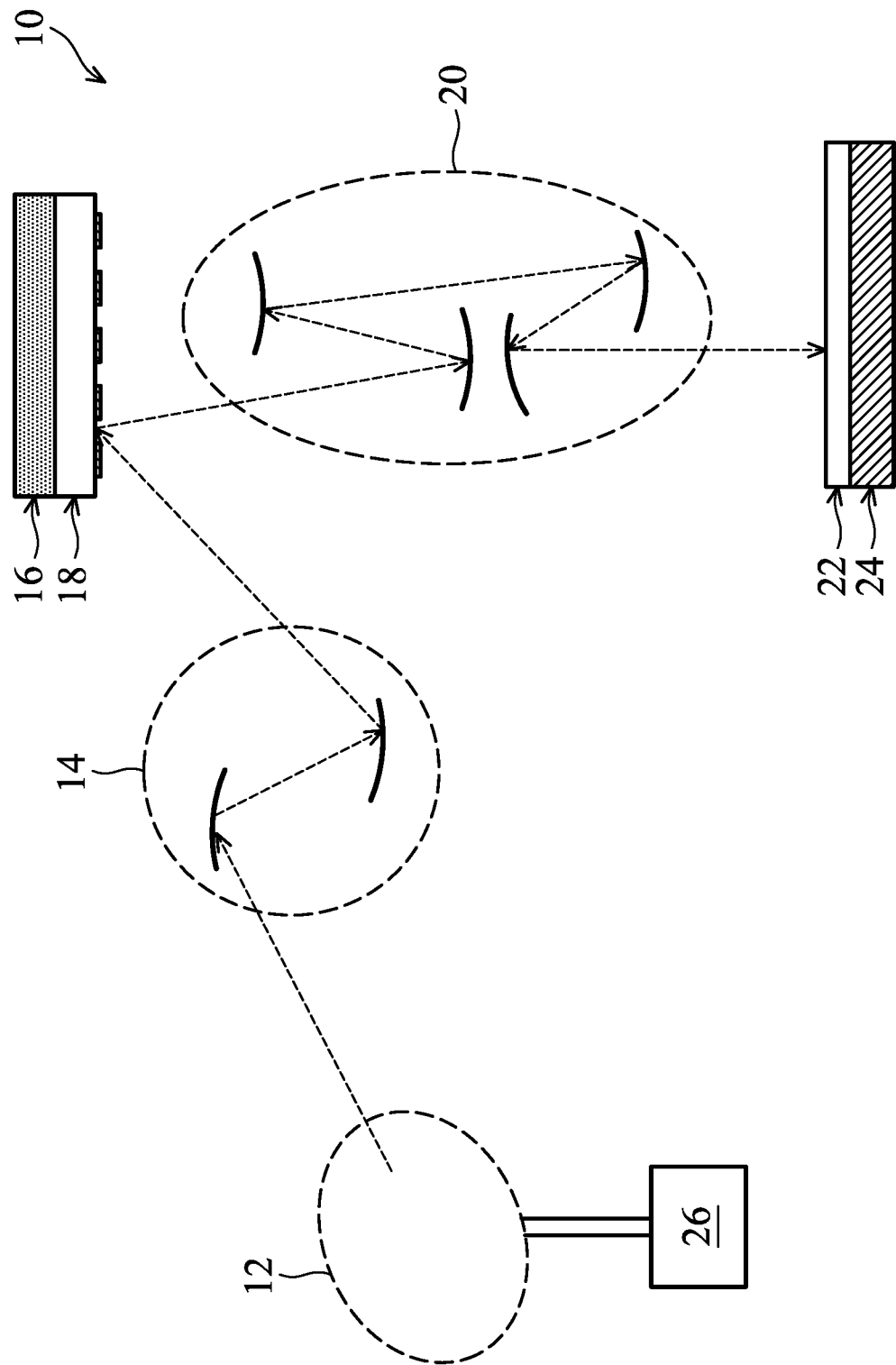
FIG. 1 shows a schematic view of a lithography system with a light source, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic and diagrammatic view of a lithography system 10, in accordance with some embodiments. The lithography system 10 may also be generically referred to as a scanner that is operable to perform lithography exposing processes with respective radiation source and exposure mode.

The lithography system 10 includes a light source 12, an illuminator 14, a mask stage 16, a mask 18, a projection optics module (or projection optics box (POB)) 20 and a substrate stage 24, in accordance with some embodiments. The elements of the lithography system 10 can be added to or omitted, and the invention should not be limited by the embodiment.

The light source 12 is configured to generate radians having a wavelength ranging between about 1 nm and about 100 nm. In one particular example, the light source 12 generates an EUV light with a wavelength centered at about 13.5 nm. Accordingly, the light source 12 is also referred to as an EUV light source. However, it should be appreciated that the light source 12 should not be limited to emitting EUV light. The light source 12 can be utilized to perform any high-intensity photon emission from excited target material.

In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the light source 12 onto a mask stage 16, particularly to a mask 18 secured on the mask stage 16. In the present embodiment where the light source 12 generates light in the EUV wavelength range, reflective optics is employed.

The mask stage 16 is configured to secure the mask 18. In some embodiments, the mask stage 16 includes an electrostatic chuck (e-chuck) to secure the mask 18. This is because the gas molecules absorb EUV light and the lithography system for the EUV lithography patterning is maintained in a vacuum environment to avoid EUV intensity loss. In the present disclosure, the terms mask, photomask, and reticle are used interchangeably.

In the present embodiment, the mask 18 is a reflective mask. One exemplary structure of the mask 18 includes a substrate with a suitable material, such as a low thermal expansion material (LTEM) or fused quartz. In various examples, the LTEM includes TiO2 doped SiO2, or other suitable materials with low thermal expansion. The mask 18 includes reflective multilayer deposited on the substrate.

The reflective multilayer includes a plurality of film pairs, such as molybdenum-silicon (Mo/Si) film pairs (e.g., a layer of molybdenum above or below a layer of silicon in each film pair). Alternatively, the reflective multilayer may include molybdenum-beryllium (Mo/Be) film pairs, or other suitable materials that are configurable to highly reflect the EUV light. The mask 18 may further include a capping layer, such as ruthenium (Ru), disposed on the reflective multilayer for protection. The mask 18 further includes an absorption layer, such as a tantalum boron nitride (TaBN) layer, deposited over the reflective multilayer. The absorption layer is patterned to define a layer of an integrated circuit (IC). Alternatively, another reflective layer may be deposited over the reflective multilayer and is patterned to define a layer of an integrated circuit, thereby forming an EUV phase shift mask.

The projection optics module (or projection optics box (POB)) 20 is configured for imaging the pattern of the mask 18 on to a semiconductor wafer 22 secured on a substrate stage 24 of the lithography system 10. In some embodiments, the POB 20 has refractive optics (such as for a UV lithography system) or alternatively reflective optics (such as for an EUV lithography system) in various embodiments. The light directed from the mask 18, carrying the image of the pattern defined on the mask, is collected by the POB 20. The illuminator 14 and the POB 20 are collectively referred to as an optical module of the lithography system 10.

In the present embodiment, the semiconductor wafer 22 may be made of silicon or other semiconductor materials. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor wafer 22 is coated with a resist layer sensitive to the EUV light in the present embodiment. Various components including those described above are integrated together and are operable to perform lithography exposing processes.

The lithography system 10 may further include other modules or be integrated with (or be coupled with) other modules. In the present embodiment, the lithography system 10 includes a gas supply module 26 designed to provide hydrogen gas to the light source 12. The hydrogen gas helps reduce contamination in the light source 12.

Figure 2:
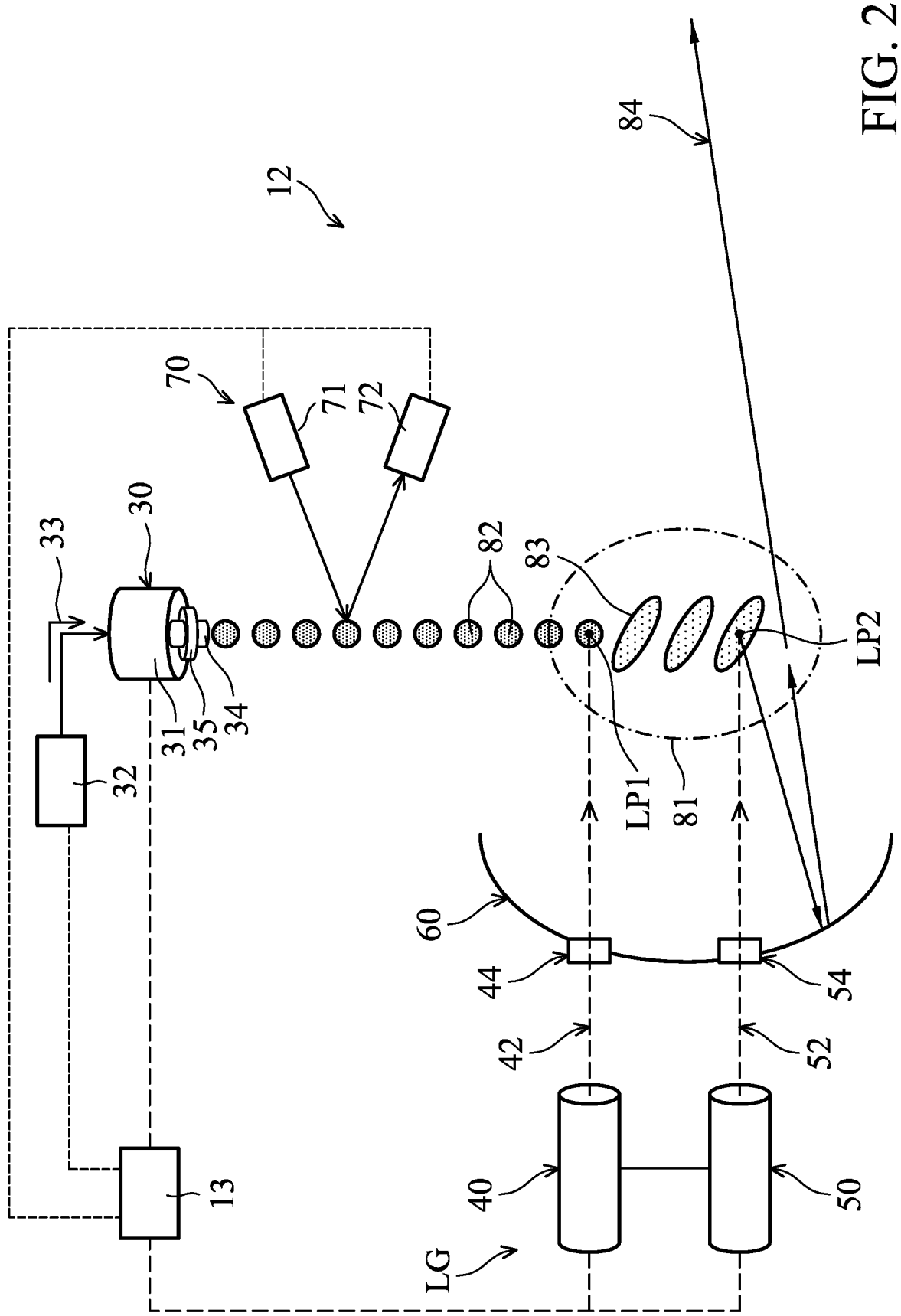
FIG. 2 is a diagrammatic view of the light source in the lithography system of FIG. 1, in accordance with some embodiments.

FIG. 2 illustrates the light source 12 in a diagrammatical view, in accordance with some embodiments. The light source 12 employs a dual-pulse laser produced plasma (LPP) mechanism to generate plasma and further generate EUV light from the plasma.

In some embodiments, the light source 12 includes a controller 13, a fuel target generator 30, a laser generator LG, a laser produced plasma (LPP) collector 60 and a monitoring device 70. The above-mentioned elements of the light source 12 may be held under vacuum. It should be appreciated that the elements of the light source 12 can be added to or omitted, and the invention should not be limited by the embodiment.

The fuel target generator 30 is configured to generate a plurality of targets 82. In some embodiments, the fuel target generator 30 includes a vessel 31 for containing a target material (not shown in figures) and a gas supplier 32. The gas supplier 32 is connected to the vessel 31 and configured to supply a pumping gas 33 into the vessel 31. The pumping gas 33 increases the pressure in vessel 31 so as to force target material contained in the vessel 31 out of the fuel target generator 30 and drive the flowing of the targets 82.

In some embodiments, a flow velocity of the targets 82 from the fuel target generator 30 is a function of the pressure of the pumping gas 33 in the fuel target generator 30. For example, the targets 82 flow faster when the pressure of the pumping gas 33 in the vessel 31 is increased, and the targets 82 flow slower when the pressure of the pumping gas 33 in the vessel 31 is reduced.

In some embodiments, the fuel target generator 30 further includes a nozzle 34 and an actuator 35. The nozzle 34 is connected to the vessel 31 for dispensing the targets 82, and the actuator 35 surrounds the nozzle 34. The actuator 35, for example, includes a piezoelectric material. The actuator 35 applies a force on the nozzle 34 in response to control signal from the controller 13 so as to supply the targets 82 with a predetermined mode.

For example, the controller 13 supplies a voltage to the actuator 35 at a given frequency, causing the actuator 35 to press the nozzle 34 at the time of receiving the voltage and stop the pressing when no voltage is received. As a result, the nozzle 34 may supply a plurality of targets 82 in the form of micro-droplets into the excitation zone 81. In some other embodiments, a droplet pitch between two neighboring targets 82 and/or the diameter of the targets 82 are controlled as a function of the frequency at which the voltage is supplied to the actuator 35.

In an embodiment, the targets 82 are tin (Sn) droplets. In an embodiment, the targets 82 each have a diameter about 30 microns (μm). In an embodiment, the targets 82 are generated at a rate about 50 kilohertz (kHz) and are introduced into a zone of excitation 81 in the light source 12 at a speed about 70 meters per second (m/s). Other material can also be used for the targets 82, for example, a tin containing liquid material such as eutectic alloy containing tin, lithium (Li), and xenon (Xe). The targets 82 may be in a solid or liquid phase.

The laser generator LG is configured to generate at least one laser to allow a conversion of the targets 82 into plasma. In some embodiments, the laser generator LG includes a first laser source 40 and a second laser source 50. The first laser source 40 is configured to produce a pre-pulse laser 42. The second laser source 50 is configured to produce a main pulse laser 52. The pre-pulse laser 42 is used to heat (or pre-heat) the targets 82 to expand the targets 82, which is subsequently irradiated by the main pulse laser 52, generating increased emission of light.

In an embodiment, the first laser source 40 is a carbon dioxide ($CO_2$) laser source. In another embodiment, the first laser source 40 is a neodymium-doped yttrium aluminum garnet (Nd:YAG) laser source. In an embodiment, the second laser source 50 is a $CO_2$ laser source.

In the present embodiment, the pre-pulse laser 42 has less intensity and a smaller spot size than the main pulse laser 52. In various embodiments, the pre-pulse laser 42 has a spot size of about 100 μm or less, and the main pulse laser 52 has a spot size about 200-300 μm, such as 225 μm. The pre-pulse laser 42 and the main pulse laser 52 are generated to have certain driving powers to fulfill wafer volume production, such as a throughput of 125 wafers per hour. For example, the pre-pulse laser 42 is equipped with about 2 kilowatts (kW) driving power, and the main pulse laser 52 is equipped with about 19 kW driving power. In various embodiments, the total driving power of the pre-pulse laser 42 and the main pulse laser 52, is at least 20 kW, such as 27 kW. However, it should be appreciated that many variations and modifications can be made to embodiments of the disclosure.

The pre-pulse laser 42 and main pulse laser 52 are directed through windows (or lenses) 44 and 54, respectively, into the zone of excitation 81 and irradiate targets 82 at a first lighting position LP1 and a second lighting position LP2. The windows 44 and 54 adopt a suitable material substantially transparent to the respective laser beams. The method for exciting the targets 82 supplied by the fuel target generator 30 is described later.

The monitoring device 70 is configured to monitor conditions of the targets 82 supplied by the fuel target generator 30. In some embodiments, the monitoring device 70 includes a transducer 71 and a detector 72. The transducer 71 is configured to generate one or more detection signals for monitoring conditions of the targets 82, and the detector 72 is configured to receive the detection signal reflected by the targets 82.

Figure 3:
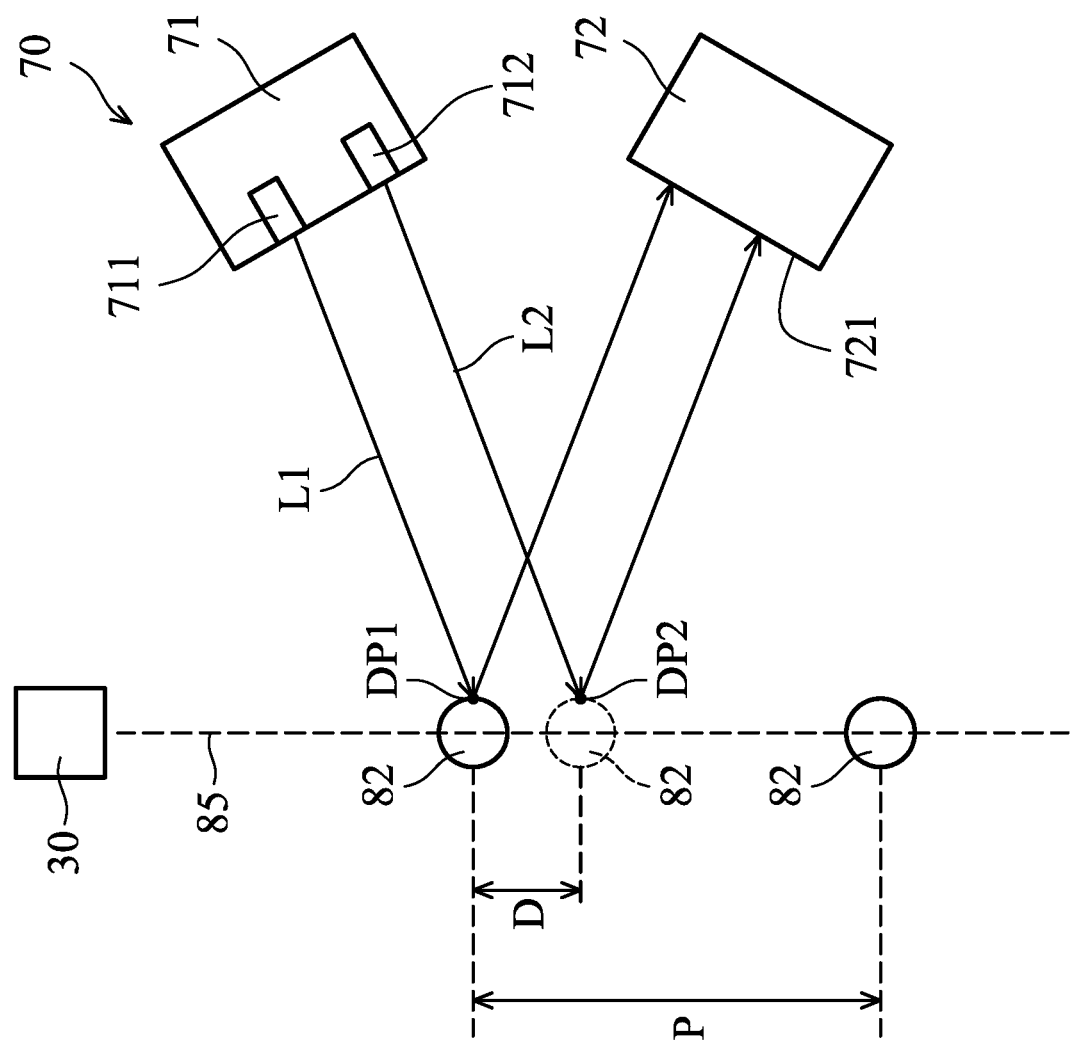
FIG. 3 is a diagrammatic view of partial elements of the light source while targets are generated by a fuel target generator, in accordance with some embodiments.

In some embodiments, as shown in FIG. 3, the transducer 71 includes two light emitters, such as first light emitter 711 and second light emitter 712. The first light emitter 711 continuously generates a first light curtain L1 during the supply of the targets 82. The second light emitter 712 continuously generates a second light curtain L2 during the supply of the targets 82. The first light emitter 711 and the second light emitter 712 are arranged so that a first detection position DP1 and a second detection position DP2 are illuminated by the first light curtain L1 and the second light curtain L2. The light curtain L1 and the light curtain L2 may each include a number of light beams arranged sequentially along a straight line or curved line. In some other embodiments, each of the first light emitter 711 and the second light emitter 712 generates a single light beam to a respective one of the first detection position DP1 and the second detection position DP2.

In some embodiments, the first detection position DP1 and the second detection position DP2 are arranged on a moving path 85 along which the targets 82 are moved. The first detection position DP1 and the second detection position DP2 are spaced apart by a distance D. The distance D is smaller than a droplet pitch P between two neighboring targets 82. The ratio between the distance D and the droplet pitch P may be about 0.1 to about 0.9. The ratio between the distance D and the droplet pitch P may be about 0.3 to about 0.5. The light curtain L1 and the light curtain L2 may each include a number of light beams arranged sequentially along a straight line or curved line. In some other embodiments, each of the first light emitter 711 and the second light emitter 712 continuously emits one single light beam.

The first light emitter 711 and the second light emitter 712 may emit radiation such as laser having wavelength about 1070 nm. The driving power of the radiation emitted by the first light emitter 711 and the second light emitter 712 is sufficiently less than the driving power of the pre-pulse laser 42 and the main pulse laser 52. The radiation from the first light emitter 711 and the radiation from the second light emitter 712 may be different or the same. For example, the wavelength of radiation emitted from the first light emitter 711 is higher than the wavelength of the radiation from the second light emitter 712 for increasing detection accuracy.

The detector 72 is arranged adjacent to the transducer 71 so as to receive light reflected from the first detection position DP1 and the second detection position DP2 when an individual target 82 passes through the first detection position DP1 and the second detection position DP2. In some embodiments, the front surface 721 of the detector 72 that is used for receiving the signals is not parallel to the moving path 85 and is oriented toward the fuel target generator 30. The front surface 721 may be inclined relative to the moving path 85 so that the reflected first light curtain L1 and the reflected second light curtain L2 are perpendicularly projected on the front surface 721. As a result, the detected intensity of the first light curtain L1 and the second light curtain L2 is maximized and noise caused by the pre-pulse laser 42 and the main pulse laser 52 is minimized.

By recording the time when the light reflected from the first detection position DP1 is detected and by recording the time when the light reflected from the second detection position DP2 is detected, the period of time during which an individual target 82 passes through the first detection position DP1 and the second detection position DP2 can be measured. In some embodiments, the detector 72 is electrically connected to the controller 13. The measured result is transmitted to the controller 13 by the detector 72 for further processing.

It should be appreciated that while there is only one detector 72 arranged for detecting the reflected light, many variations and modifications can be made to embodiments of the disclosure. In some other embodiments, there are two detectors 72 are used to receive light reflected from the first detection position DP1 and the second detection position DP2.

In addition, while the embodiment shown in FIG. 3 uses optical signals (e.g., laser) for measuring the period of time that targets pass two detection positions, other technique can be utilized for measuring the period of time. For example, the monitoring device 70 may include a camera and an image analyzer. The camera is used to capture images of the targets 82 when they pass through the first detection position DP1 and the second detection position DP2. With the recorded images, the period of time that the individual target passes two detection positions can be measured by analyzing the images of the first detection position DP1 and the second detection position DP2 with an image analyzer.

The controller 13 is configured to control one or more elements of the light source 12. In some embodiments, the controller 13 is configured to drive the fuel target generator 30 to generate the targets 82. In addition, the controller 13 is configured to drive the first laser source 40 and the second laser source 50 to fire the pre-pulse laser 42 and the main pulse laser 52. The generation of the pre-pulse laser 42 and the main pulse laser 52 may be controlled to be associated with the generation of targets 82 by the controller 13 so as to make the pre-pulse laser 42 and the main pulse laser 52 hit each target 82 in sequence. Moreover, the controller 13 is configured to control the supply of pumping gas 33 from the gas supplier 32 into the fuel target generator 30 so as to change the flow velocity of the targets 82 from the fuel target generator 30.

The controller 13 may be a computer system. In one example, the computer system includes a network communications device or a network computing device (for example, a mobile cellular phone, a laptop, a personal computer, a network server, etc.) capable of communicating with a network. In accordance with embodiments of the present disclosure, the computer system performs specific operations via a processor executing one or more sequences of one or more instructions contained in a system memory component.

The processor may include a digital signal processor (DSP), a microcontroller (MCU), and a central processing unit (CPU). The system memory component may include a random access memory (RAM) or another dynamic storage device or read only memory (ROM) or other static storage devices, for storing data and/or instructions to be executed by the processor. For example, the system memory component may store a predetermined value of a flow velocity of targets, a predetermined value of the period of time during an individual target passé two detection position, or an acceptable range for adjusting parameter of the laser generator.

Figure 4:
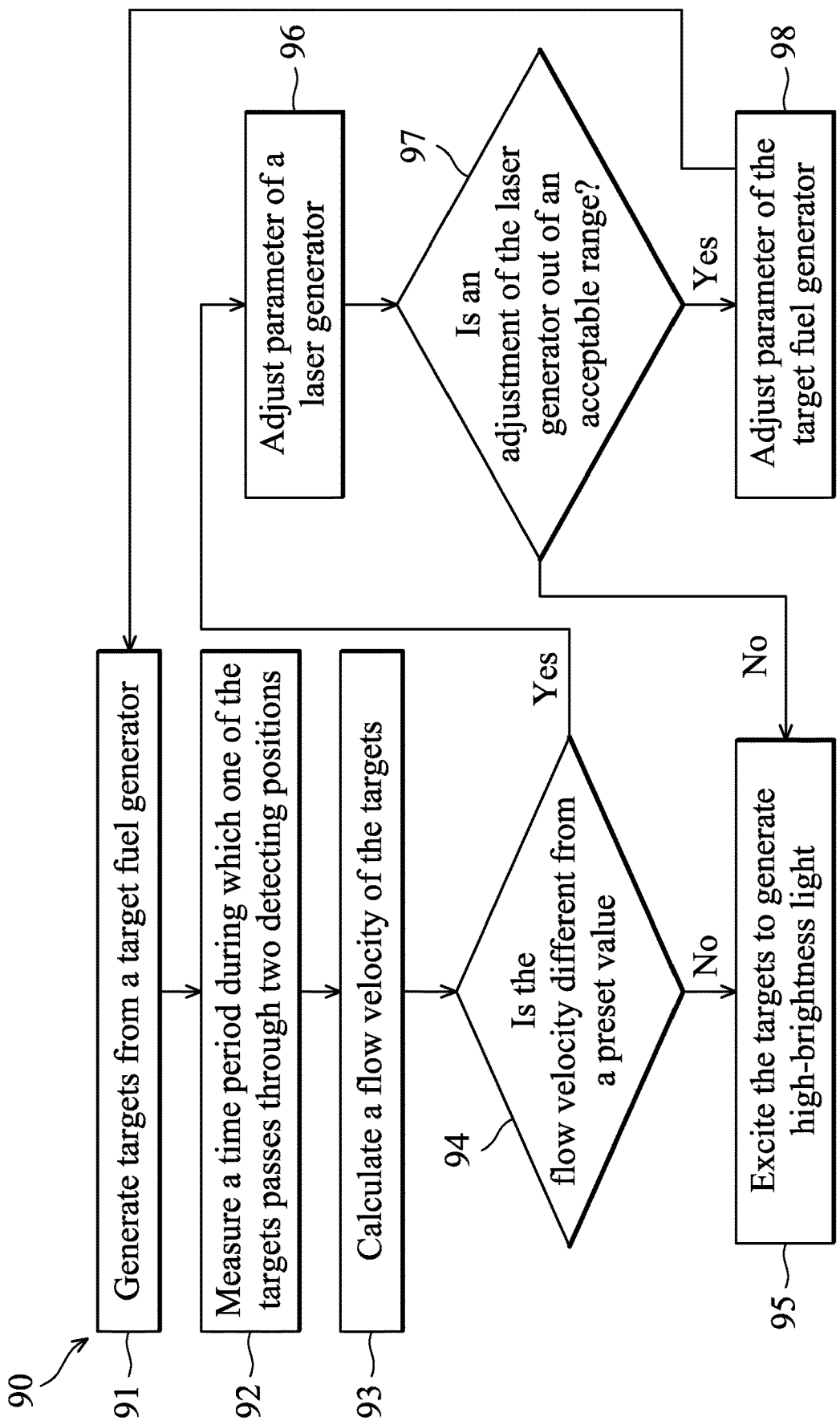
FIG. 4 is a flowchart of a method for a generating light, in accordance with some embodiments.

FIG. 4 is a flowchart of a method 90 for generating a light, in accordance with some embodiments. For illustration, the flow chart will be described along with the drawings shown in FIGS. 1-3 and 5. Some of the described transportation stages can be replaced or eliminated in different embodiments.

The method 90 includes operation 91, in which targets 82 are generated by forcing the target material out of the droplet generator 30. In some embodiments, the fuel target generator 30 shown in FIG. 2 is configured to generate the targets 82. The fuel target generator 30 is controlled to generate targets 82 with the proper material, proper size, proper frequency, and proper flow velocity and direction according to a processing recipe.

The method 90 also includes operation 92 in which the period of time during which one of the targets 82 passes through the first detection position DP1 and the second detection position DP2 is measured. In some embodiments, operation 92 is performed by the monitoring device 70. As shown in FIG. 3, the first light curtain L1 and the second light curtain L2 from the transducer 71 continuously illuminate on the first detection position DP1 and the second detection position DP2, respectively.

When one of the targets 82 passes through the first detection position DP1 at time t1, the first light curtain L1 is reflected by the target 82 and detected by the detector 72. In addition, when the targets 82, as indicated by dotted line, passes through the second detection position DP2 at time t2, the second light curtain L2 is reflected by the target 82 and detected by the detector 72.

Figure 5:
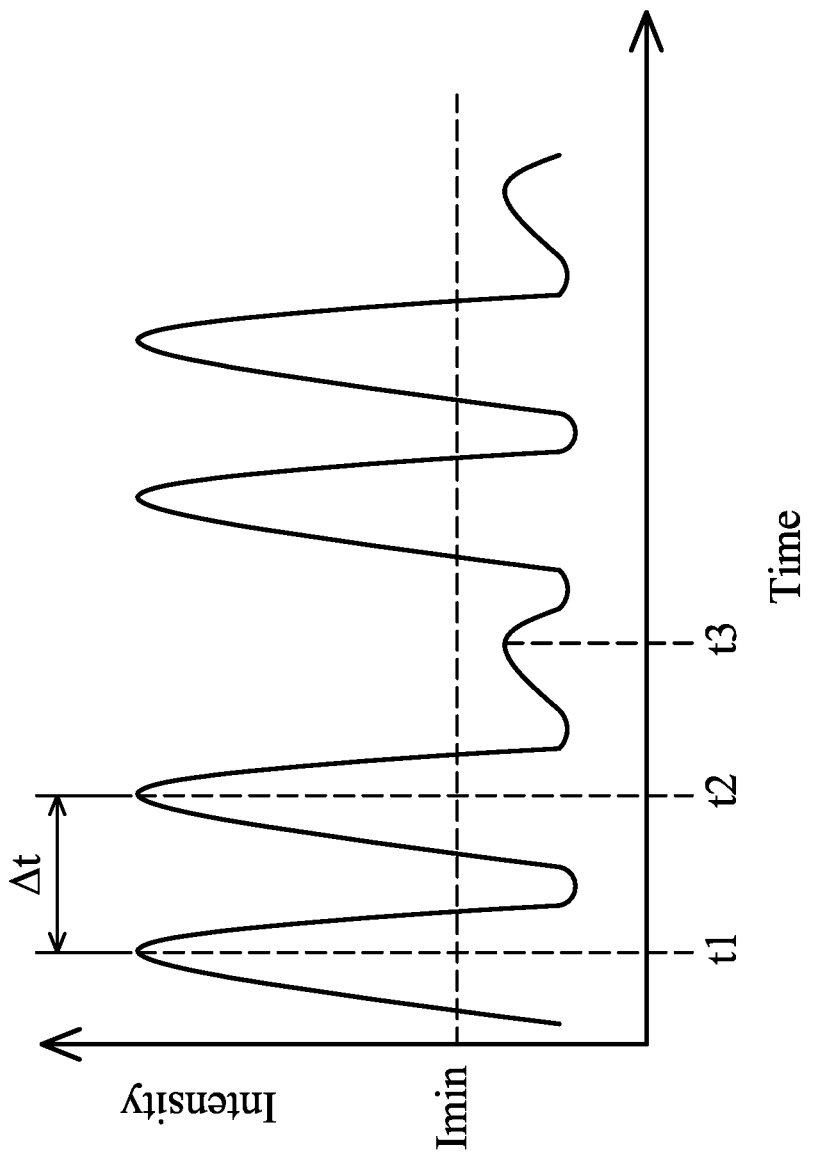
FIG. 5 is a diagram of a signal intensity detected by a detector versus time, in accordance with some embodiments.

One embodiment of the detection result of the detector 72 is shown diagram of FIG. 5. A period of time $\Delta t$ between time t1 and time t2 can be measured by subtracting the time t2 by the time t1. In some embodiments, radiation from the pre-pulse laser 42 or the main pulse laser 52 is also detected by the detector 72 and produces signal at time t3. This noise signal may be mitigated by positioning the detector 72 in a proper manner, or by utilizing a filtering technique to ignore signal having intensity less than $I_{min}$.

The method 90 also includes operation 93, a flow velocity of the targets 82 is calculated. In some embodiments, the data associated the time difference $\Delta t$ is sent to the controller 13. The controller 13 calculates flow velocity of the targets 82 by dividing the distance D (FIG. 3) by the measured time difference $\Delta t$. Afterwards, the method 90 continues with operation 94, in which the controller 13 determines if the calculated flow velocity is different from a predetermined value of the predetermined processing recipe.

When the calculated flow velocity is the same as the predetermined value of the predetermined processing recipe, the method continues with operation 95. In operation 95, the targets 82 are excited to generate light. One method for exciting the targets 82, in accordance with some embodiments, is described below.

In the beginning, the first laser source 40 is used to generate the pre-pulse laser 42 to expand the targets 82 at the first lighting position LP1. Before being irradiated by the pre-pulse laser 42, the targets 82 have circular shape. After the targets 82 are irradiated by the pre-pulse laser 42, a portion of the pre-pulse laser 42 is converted to kinetic energy to transform the targets 82 to expanded targets 83 with pancake-shape, as shown in FIG. 2.

Afterwards, the second laser source 50 is used to generate the main pulse laser 52 to excite the expanded targets 83 at the second lighting position LP2. The main pulse laser 52 heats the expanded targets 83 to a preset temperature. At the preset temperature, the target material 80 in the expanded targets 83 shed their electrons and become a plasma that emits light 84.

In some embodiments, the first laser source 40 is configured to generate the pre-pulse laser 42 after a time interval when the detector 72 receives the first light curtain L1. Because the targets 82 are moved as the desired flow velocity and because an intermediate distance between the first detection position DP1 and the first lighting position LP1 is fixed, the time interval can be calculated by dividing the intermediate distance by the desired flow velocity. As a result, the targets 82 can be accurately irradiated by the pre-pulse laser 42 when the targets 82 reach the first lighting position LP1.

On the other hand, when the calculated flow velocity is different from the preset value of the predetermined processing recipe, the method continues with operation 96. In operation 96, the parameter of the laser generator LG is adjusted. In some embodiments, the firing time or the firing frequency of the pre-pulse laser 42 and the main pulse laser 52 is adjusted by the controller 13 according to the calculated flow velocity so as to accurately irradiate the targets 82 once the targets 82 get the first lighting position LP1 and the second lighting position LP2.

For example, when the calculated flow velocity is greater than the predetermined value of the predetermined processing recipe, which means many more targets will pass through the first lighting position LP1 and the second lighting position LP2, an increase in the firing frequency may allow most of the targets 82 to be irradiated by the pre-pulse laser 42 and the main pulse laser 52. Conversely, when the calculated flow velocity is less than the predetermined value of the predetermined processing recipe, a decrease in the firing frequency may allow most of the targets 82 to be irradiated by the pre-pulse laser 42 and the main pulse laser 52.

In some embodiments, in the cases where the distance D between the first detection position DP1 and second detection position DP2 is fixed, operation 93 is omitted, and the measure period of time is compared with a predetermined value associated a desired period of time according to a processing recipe. It should be noted that the predetermined value described above may be refer to as a specific value, a range of value, or multiple ranges of value.

The method 90 also includes operation 97, in which the operating status of the laser generator LG is monitored to determine if the adjustment of the laser generator LG is outside of an acceptable range. In some embodiments, an upper limit firing frequency and a lower limit firing frequency are set by the controller 13. When the desired firing frequency associated the calculated flow velocity is within an acceptable range between the upper limit firing frequency and the lower limit firing frequency, the controller 13 actuates the adjustment of the laser generator LG, and the method continues to operation 95.

On the other hand, when the desired firing frequency associated the calculated flow velocity is outside of the acceptable range between the upper limit firing frequency and the lower limit firing frequency, the controller 13 may not adjust the laser generator LG to the desired firing frequency, and instead at least one parameter of the fuel target generator 30 is adjusted (operation 98). This is because irradiating the targets 82 with lasers having a firing frequency that is higher than the upper limit may cause the light source to become contaminated by debris, and because irradiating the targets 82 using lasers with a firing frequency that is less than the lower limit may lead to a decrease in the power of the light 84.

In some embodiments, in operation 98, the pressure of the pumping gas 33 in the fuel target generator 30 is modified so that the flow velocity of the targets 82 from the fuel target generator 30 is adjusted accordingly. A method for determining the modified pressure of the pumping gas 33 may include calculating difference between the detected flow velocity or the measured period of time and the predetermined value. The method further includes comparing the calculated difference with a lookup table (not shown) to determine the amount of pressure required to increase or decrease.

In some other embodiments, the frequency of the voltage supplied to the actuator 35 is changed, so that the frequency for generating the targets 82 is adjusted accordingly. With such adjustments to the parameters of the fuel target generator 30, the targets 82 can be irradiated with the pre-pulse laser 42 and the main pulse laser 52 at the proper angle and energy, and the power conversion efficiency of the targets to the light is improved.

It should be appreciated that while operation 98 is performed after operations 96 and 97, the embodiments should not be limited thereto. In some other embodiments, operations 96 and 97 are omitted, and operation 98 is initiated right after operation 94 when the flow velocity is different from the predetermined value. Alternatively, operation 96 and operation 98 can be performed the same time. That is, the conditions of the targets 82 are modified to a desired mode by simultaneously adjusting parameters of the laser generator LG and the fuel target generator 30.

In some other embodiments, if the adjusted parameter of the fuel target generator 30 is outside of an acceptable range, a warning signal is issued by the controller 13. The warning signal is sent to the fuel target generator 30 to stop the supply of the targets 82. In addition, the warning signal triggers the operation of warning equipment (such as a warning light or warning ring not shown in figures) to call a personnel to perform a maintenance process.

The method 90 may be performed before a beginning of a lithography exposure process. Alternatively, the method 90 may be periodically performed after a given amount of semiconductor wafers are process the by the lithography system 10. Alternatively, the method 90 may be performed during the lithography exposure process.

Figure 6:
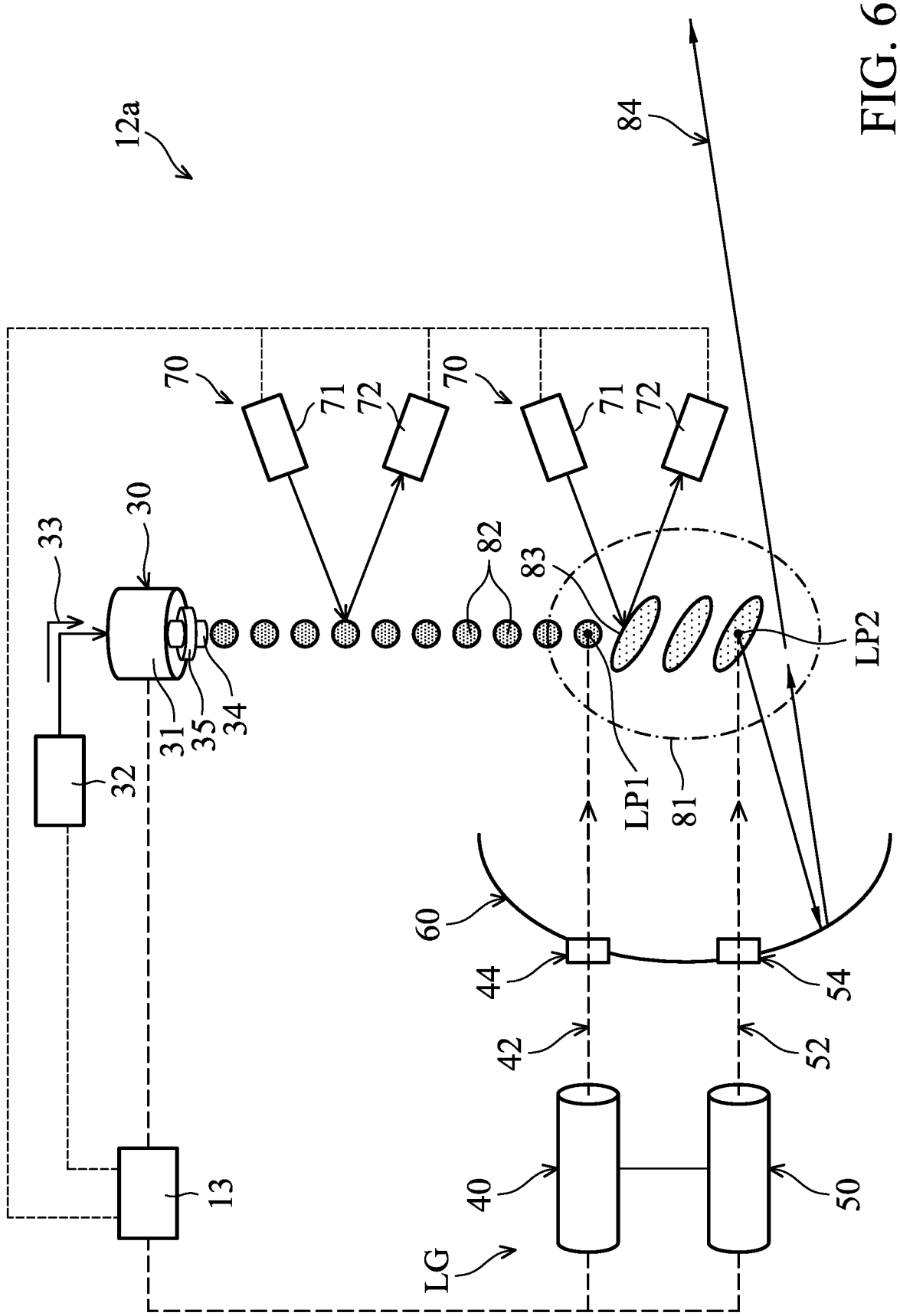
FIG. 6 is a diagrammatic view of a light source in the lithography system, in accordance with some embodiments.

FIG. 6 is a diagrammatic view of the light source 12a in the lithography system, in accordance with some embodiments. In the embodiments shown in FIG. 6, elements that are similar to those shown in FIG. 2 are provided with the same reference numbers, and the features thereof are not reiterated in the interests of brevity. Differences between the light source 12a and the light source 12 include the light source 12a including two monitoring devices 70. In some embodiments, the additional monitoring device 70 is arranged such that the condition of expanded targets 83 can be detected.

In some embodiments, the additional monitoring device 70 can detect more than the flow velocity of the expanded targets 83. For example, by calculating the duration of the reflected light curtain received by the additional monitoring device 70, the length of the expanded targets 83 can be detected. With such additional information about the expanded targets 83, the expanded targets 83 can be accurately irradiated with the main pulse laser 52, and higher power conversion can be achieved.

Embodiments of a method for generating light in lithography exposure process are provided. Parameters of a light source are adjusted according to collected information of the targets during the lithography exposure process. Therefore, light emission conversion efficiency is enhanced, and contamination of the light emitting system by debris is reduced.

In accordance with some embodiments, a method for generating light in lithography exposure process is provided. The method further includes measuring a period of time during which one of targets from a fuel target generator passes through two detection positions. The method also includes exciting the targets with a laser generator so as to generate plasma that emits light, wherein the operation of exciting the targets with the laser generator includes: irradiating a pre-pulse laser on the targets to expand the targets; detecting conditions of expanded targets; and adjusting at least one parameter of the laser generator according to the measured period of time and the conditions, when the measured period of time is different from a predetermined value, wherein the parameter of the laser generator which is adjusted according to the measured period of time comprises a frequency for generating a laser for illuminating the targets.

In accordance with some embodiments, a method for generating light in lithography exposure process is provided. The method includes detecting a flow velocity of targets from a fuel target generator at a first detection position and a second detection position. The method further includes adjusting the flow velocity of the targets in response to the detected flow velocity when the detected flow velocity is different from a predetermined value. The method also includes irradiating at least one laser with a laser generator on the targets to generate plasma that emits light. In addition, the operation of irradiating the at least one laser on the targets includes: irradiating a pre-pulse laser on the targets to expand the targets; detecting conditions of expanded targets; and adjusting a parameter of the laser generator according to the detected flow velocity and the conditions. Furthermore, the operation of detecting the flow velocity of the targets includes: projecting a first light curtain and a second light curtain at the first detection position and the second detection position, respectively, on a moving path; receiving light reflected from one of the targets when the one of the targets passes through the first detection position and the second detection position; measuring a time difference between a time when the light reflected from the target at the first detection position is detected and a time when the light reflected from the target at the second detection position is detected; and determining a flow velocity of the targets by dividing a distance between the first detection position and the second detection position by the measured time difference.

In accordance with some embodiments, a method for generating light in lithography exposure process is provided. The method further includes measuring a period of time during which one of targets from a fuel target generator passes through two detection positions. The method also includes exciting the targets with a laser generator so as to generate plasma that emits light, wherein the operation of exciting the targets with the laser generator includes: irradiating a pre-pulse laser on the targets to expand the targets; detecting length of expanded targets; and adjusting at least one parameter of the laser generator according to the measured period of time and the length of expanded targets, when the measured period of time is different from a predetermined value, wherein the parameter of the laser generator which is adjusted according to the measured period of time comprises a frequency for generating a laser for illuminating the targets.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for generating light in a lithography exposure process, comprising:
    measuring a period of time during which one of targets from a fuel target generator passes through two detection positions;
    exciting the targets with a laser generator so as to generate plasma that emits light, wherein the operation of exciting the targets with the laser generator comprises:
    irradiating a pre-pulse laser on the targets to expand the targets;
    detecting conditions of expanded targets; and
    adjusting at least one parameter of the laser generator according to the measured period of time and the conditions, when the measured period of time is different from a predetermined value, wherein the parameter of the laser generator which is adjusted according to the measured period of time comprises a frequency for generating a laser for illuminating the targets.

2. The method for generating light in a lithography exposure process as claimed in claim 1, wherein the operation of measuring the period of time comprises:
    projecting a first light curtain and a second light curtain at the two detection positions;
    receiving light reflected from one of the targets when the one of the targets passes through the two detection positions; and
    measuring a period of time between a time when the light reflected from the target at a first detection position is detected and a time when the light reflected from the target at as second detection position is detected.

3. The method for generating light in a lithography exposure process as claimed in claim 1, wherein the targets generated from the fuel target generator are separated by a droplet pitch, and a distance between the two detection positions is smaller than the droplet pitch.

4. The method for generating light in a lithography exposure process as claimed in claim 1, wherein the two detection positions are located between the fuel target generator and a lighting position where the targets are focused by the pre-pulse laser.

5. The method for generating light in a lithography exposure process as claimed in claim 1, wherein the pre-pulse laser irradiates the targets to expand the targets at a first lighting position, and the operation of exciting the targets to generate plasma further comprises:
    irradiating a main pulse laser on the expanded target to generate the plasma at a second lighting position;
    wherein the two detection positions are located between the first lighting position and the second lighting position.

6. The method for generating light in a lithography exposure process as claimed in claim 1, further comprising adjusting a parameter of the fuel target generator according to the measured period of time, wherein the parameter of the fuel target generator comprises a flow velocity of the targets generated from the fuel target generator.

7. A method for generating light in a lithography exposure process, comprising:

detecting a flow velocity of targets from a fuel target generator at a first detection position and a second detection position;

adjusting the flow velocity of the targets in response to the detected flow velocity when the detected flow velocity is different from a predetermined value; and irradiating at least one laser on the targets with a laser generator to generate plasma that emits light;

wherein the operation of irradiating the at least one laser on the targets comprises:

irradiating a pre-pulse laser on the targets to expand the targets;

detecting conditions of expanded targets; and adjusting a parameter of the laser generator according to the detected flow velocity and the conditions;

wherein the operation of detecting the flow velocity of the targets comprises:

projecting a first light curtain and a second light curtain at the first detection position and the second detection position, respectively, on a moving path;

receiving light reflected from one of the targets when the one of the targets passes through the first detection position and the second detection position;

measuring a time difference between a time when the light reflected from the target at the first detection position is detected and a time when the light reflected from the target at the second detection position is detected; and determining a flow velocity of the targets by dividing a distance between the first detection position and the second detection position by the measured time difference;

wherein the parameter of the laser generator which is adjusted according to the measured time difference comprises a frequency for generating a laser for illuminating the targets.

8. The method for generating light in a lithography exposure process as claimed in claim 7, further comprising:

calculating a time interval by dividing an intermediate distance by the detected velocity, wherein the intermediate distance is between the first detection position and a lighting position where the targets are illuminated by the laser; and wherein the laser is actuated after the time interval when the light reflected from the target at the first detection position is detected.

9. The method for generating light in a lithography exposure process as claimed in claim 7, wherein the operation of irradiating at least one laser on the targets comprises:

irradiating a main pulse laser on the expanded target to generate plasma that emits light;

wherein the velocity of the targets is detected before the targets are expanded by the pre-pulse laser.

10. The method for generating light in a lithography exposure process as claimed in claim 7, wherein the operation of irradiating at least one laser on the targets comprises:

irradiating a main pulse laser on the expanded target to generate plasma that emits light;

wherein the velocity of the targets is detected after the targets are expanded by the pre-pulse laser and before the expanded targets are irradiated by the main pulse laser.

11. The method for generating light in a lithography exposure process as claimed in claim 7, wherein the step of detecting conditions of expanded targets includes detecting length of expanded targets.

12. A method for generating light in a lithography exposure process, comprising:

measuring a period of time during which one of targets from a fuel target generator passes through two detection positions;

exciting the targets with a laser generator so as to generate plasma that emits light, wherein the operation of exciting the targets with a laser generator comprises:

irradiating a pre-pulse laser on the targets to expand the targets;

detecting length of expanded targets; and adjusting at least one parameter of the laser generator according to the measured period of time and the length of expanded targets, when the measured period of time is different from a predetermined value, wherein the parameter of the laser generator which is adjusted according to the measured period of time comprises a frequency for generating a laser for illuminating the targets.

13. The method for generating light in a lithography exposure process as claimed in claim 12, wherein the operation of measuring the period of time comprises:

projecting a first light curtain and a second light curtain at the two detection positions;

receiving light reflected from one of the targets when the one of the targets passes through the two detection positions; and measuring a period of time between a time when the light reflected from the target at a first detection position is detected and a time when the light reflected from the target at as second detection position is detected.

14. The method for generating light in a lithography exposure process as claimed in claim 12, wherein the targets generated from the fuel target generator are separated by a droplet pitch, and a distance between the two detection positions is smaller than the droplet pitch.

15. The method for generating light in a lithography exposure process as claimed in claim 12, wherein the two detection positions are located between the fuel target generator and a lighting position where the targets are focused by the pre-pulse laser.

16. The method for generating light in a lithography exposure process as claimed in claim 12, wherein the pre-pulse laser irradiates the targets to expand the targets at a first lighting position, and the operation of exciting the targets to generate plasma further comprises:

irradiating a main pulse laser on the expanded target to generate the plasma at a second lighting position;

wherein the two detection positions are located between the first lighting position and the second lighting position.

17. The method for generating light in a lithography exposure process as claimed in claim 12, further comprising adjusting a parameter of the fuel target generator according to the measured period of time, wherein the parameter of the fuel target generator comprises a flow velocity of the targets generated from the fuel target generator.

18. The method for generating light in a lithography exposure process as claimed in claim 12, wherein the laser generator comprises:

a first laser source configured to generate the pre-pulse laser for expanding the targets at a first lighting position;

wherein the two detection positions are located between the fuel target generator and the first lighting position.

19. The method for generating light in a lithography exposure process as claimed in claim 12, wherein the laser generator comprises:

a first laser source configured to generate the pre-pulse laser for expanding the targets at a first lighting position; and a second laser source positioned farther away from the fuel target generator than the first laser source and configured to generate a main pulse laser for exciting the expanded targets at a second lighting position;

wherein the two detection positions are located between the first lighting position and the second lighting position.

20. The method for generating light in a lithography exposure process as claimed in claim 12, wherein the period of time is measured by a monitoring device, and the length of expanded targets is detected by another monitoring device.

* * * * *